United States Patent
Kameyama

(10) Patent No.: US 6,711,354 B2
(45) Date of Patent: Mar. 23, 2004

(54) AUXILIARY MODULE USE RELAYING COMPONENT AND AUXILIARY MODULE

(75) Inventor: Isao Kameyama, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 25 days.

(21) Appl. No.: 10/086,701

(22) Filed: Mar. 4, 2002

(65) Prior Publication Data

US 2002/0121809 A1 Sep. 5, 2002

(30) Foreign Application Priority Data

Mar. 5, 2001 (JP) ........................................ 2001-060230

(51) Int. Cl.[7] ................................................. G03B 7/26
(52) U.S. Cl. ........................ 396/301; 396/427; 396/542; 361/785; 174/52.2
(58) Field of Search ................................ 396/301, 427, 396/542; 361/785; 174/52.2

(56) References Cited

U.S. PATENT DOCUMENTS 5,097,592 A * 3/1992 Schultz et al. ................ 29/832
6,124,886 A * 9/2000 DeLine et al. ............... 348/148
2002/0045376 A1 * 4/2002 Abe et al. ..................... 439/374

FOREIGN PATENT DOCUMENTS

| JP | 47-33986 | 11/1972 |
| JP | 64-29790 | 2/1989 |

* cited by examiner

Primary Examiner—David M. Gray
(74) Attorney, Agent, or Firm—Armstrong, Kratz, Quintos, Hanson & Brooks, LLP.

(57) ABSTRACT

An auxiliary module comprises: a baseplate having terminals and equipped with an auxiliary; a relaying component formed by integrally resin-molding a first electrically connecting portion having terminals and a second electrically connecting portion having terminals; and a casing, wherein a connector housing for the first electrically connecting portion is formed on the casing, a connector is formed on the casing by installing the first electrically connecting portion in the connector housing, and the terminals of the baseplate are connected to the terminals of the second electrically connecting portion when the baseplate is attached to the casing.

13 Claims, 7 Drawing Sheets

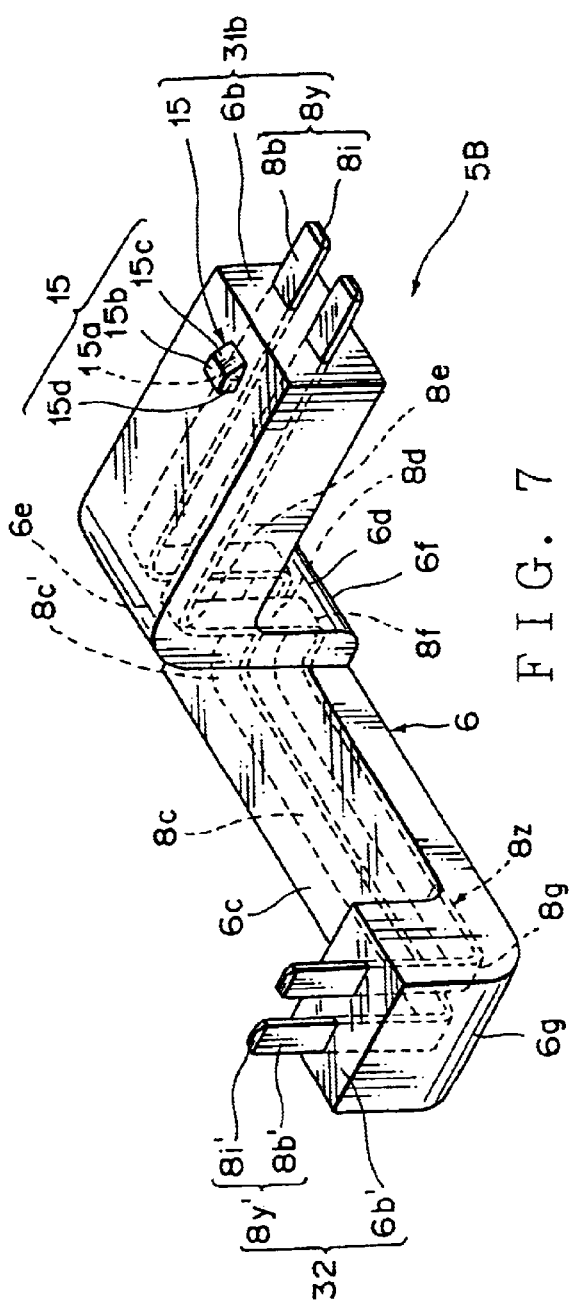
FIG. 7
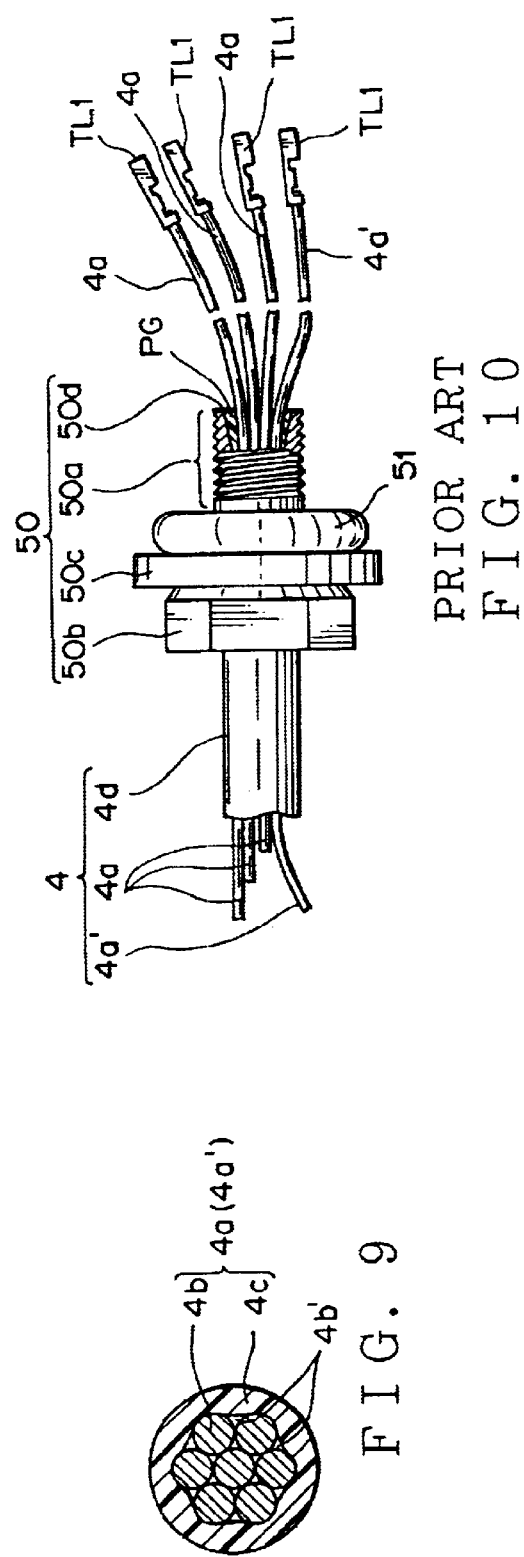
FIG. 9
PRIOR ART
FIG. 10

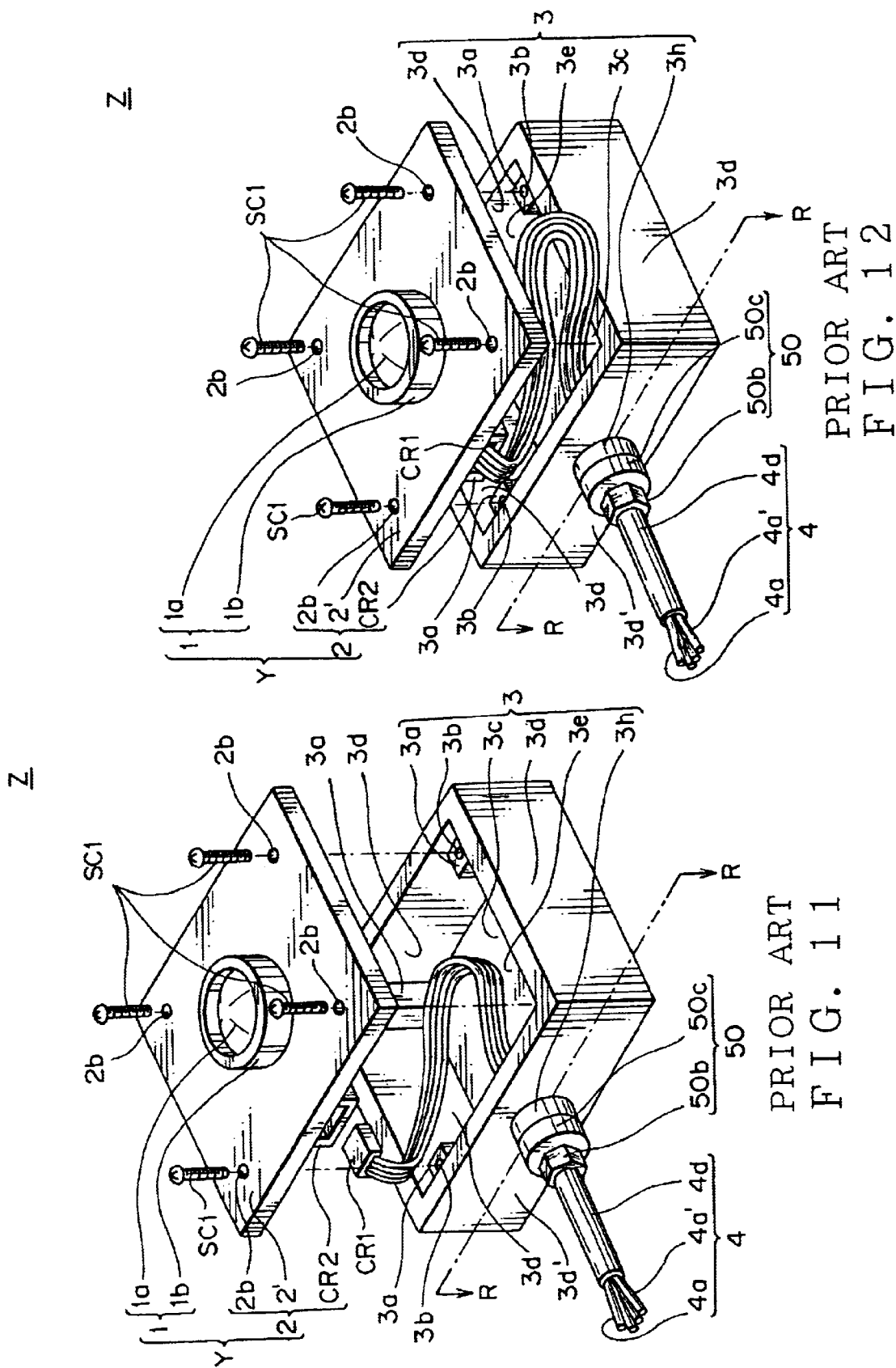

AUXILIARY MODULE USE RELAYING COMPONENT AND AUXILIARY MODULE

BACKGROUND OF THE INVENTION

1. Field of the invention

The present invention relates to an auxiliary module for attachably and detachably connecting a casing, provided with an auxiliary like an onboard CCD camera and with a baseplate, with mating parts like wires by using connectors and to a relaying component used in the auxiliary module, wherein a catch of the wires is prevented when the auxiliary module is assembled.

2. Description of the Related Art

Based on FIG. 10–FIG. 13, a prior art camera module Z is described. FIG. 10 is an enlarged view of a part of a wiring harness 4 having a clamp 50 with an O-ring 51. The wiring harness is generally formed by binding wires and attachin connectors thereto so that the wires and connectors can be easily assembled to a motor vehicle in its assembly line.

The O-ring 51 shown in FIG. 10 is provided to the clamp 50 so as to keep airtightness in the camera casing 3. The clamp 50 has a threaded portion 50a to securely fix itself to the camera casing 3, a hexagon head portion 50b, and a flange portion 50c to push the O-ring 51 to seal.

And, a passing-through hole 50d to let wires or cables 4a,4a' pass therethrough is provided inside the clamp 50. As shown in FIG. 10, terminals TL1 are attached to the wires 4a,4a'. Each terminal TL1 is accommodated in a connector housing. Like this, a connector CR1 is formed at the end of the wiring harness 4 as shown in FIG. 11. The connector housing holds the terminals properly in accommodating chambers. The connector has the connector housing, terminals, and wires.

The clamp 50 shown in FIG. 10 is potting-processed after the wires 4a,4a' are inserted therein. The potting processing PG is easily described as a processing of sealing a portion by pouring soft rubber like epoxy polymer.

By the potting processing PG, the wires 4a,4a' can be completely sealed up, and therefore an immersion of water and dust into the camera 1 and the camera casing 3 can be prevented.

FIGS. 11,12 are perspective views of a prior art camera module Y,Z with an onboard CCD camera 1. The camera module Y mainly consists of the camera 1, such as a onboard CCD camera 1, and a baseplate 2 provided with the camera 1. And, the camera module Z has the camera module Y, a camera casing 3 to which the camera module Y is attached, and the wiring harness 4 having the wires 4a,4a'.

FIG. 13 is a partial sectional view, taken along a line R—R in FIG. 11 and FIG. 12, of the camera casing 3, while showing another parts to which a wiring harness 4 is connected.

CCD (Charge Coupled Device) converts signals, taken in as light of image, into electrical signals, and has a large number of pixels. CCD is adopted to the digital camera, facsimile, scanner, duplicator machine, and the like.

The prior art camera module Z shown in FIG. 11–FIG. 13 is described in detail. Referring to FIGS. 11,12, the camera 1 mainly consists of a lens 1a and a lens rim portion 1b fixing the lens 1a. Next, the baseplate 2 to which the camera 1 is attached is mainly formed with a baseplate body 2', on which, for example, connectors to carry out electric connection are mounted.

A connector CR2 is provided on the baseplate 2 of the camera module Y. The connector housing of the connector CR2 is soldered, or screwed, to the baseplate body 2'. Four attaching holes 2b for fixing the baseplate 2 by screws SC1 to the camera casing 3 are provided on the baseplate body 2'.

The camera casing 3 made by aluminum-die-casting is surrounded by four sidewalls 3d, 3d' and a bottom wall 3c, thereby forming an accommodating chamber 3e. And, a cylindrical projection 3h to fix the clamp 50 is provided on the sidewall 3d'. Four screw fixing bodies each having an internal-thread hole 3b to fix the baseplate 2 having the camera 1 are provided in the accommodating chamber 3e of the camera casing 3.

Referring to FIG. 13, a through-hole 3f to put the wiring harness 4 therethrough is provided on the sidewall 3d' of the camera casing 3. And, an internal-thread to be screwed with the threaded portion 50a of the clamp 50 is provided on an inner surface of the through-hole 3f. The clamp 50 shown in FIG. 10 is attached to the through-hole 3f provided on the sidewall 3d' of the camera casing 3.

As shown in FIG. 13, a non-waterproof connector CR3 equipped in a vehicle V is electrically connected to the camera casing 3 by the wiring harness 4. And, a drain wire 4a' of the wiring harness 4 is provided with a terminal TL2, which terminal TL2 is attached to a frame of a vehicle body B by a screw SC2, thereby functioning as the ground line.

And, referring to FIG. 11 and FIG. 12, the connector CR1 connected to the wires 4a,4a' is coupled to the connector CR2 equipped on the baseplate 2, thereby making an electric connection therebetween. A grommet (not shown) is provided on some portions of the wiring harness 4 for the purpose of the waterproofing or dustproofing.

An assembly method of the camera module Z having the onboard CCD camera 1 of the prior art is described hereinafter. First, the clamp 50 with the O-ring 51 is attached to the wiring harness 4 shown in FIG. 13. Next, the wiring harness 4 with the wires 4a,4a' is inserted in the passing-through hole 50d of the clamp 50. And, the clamp 50 is fixed to the wiring harness 4 provisionally.

A tube 4d of the wiring harness 4 inside the camera casing 3 has been cut off, and the terminal TL1 is attached to each end of the wires 4a,4a'. The connector CR1 shown in FIG. 11 is formed by accommodating terminals TL1 in its housing.

In order to improve the sealability between the wiring harness 4 and the clamp 50, resin or rubber is filled into the passing-through hole 50d of the clamp 50 shown in FIG. 10, that is, the potting processing PG is carried out.

Next, as shown in FIG. 13, the above clamp 50 with the wires 4a,4a' is attached to the through-hole 3f of the camera casing 3. And, the threaded portion 50a of the clamp 50 is screwed to the through-hole 3f of the camera casing 3, and the clamp 50 is fixed to the camera casing 3. By the O-ring 51 and the potting processing PG, sealability or airtightness of the camera casing 3 is attained.

And, the baseplate 2 with the camera 1, i.e. the camera module Y, is attached to the camera casing 3 as follows. Referring to FIG. 11 and FIG. 12, the connector CR1 of the wiring harness 4 is connected to the connector CR2 provided on the baseplate body 2'.

The camera module Y is put on the camera casing 3, and the screws SC1 are screwed in the internal-thread holes 3b provided on the four corners of the camera casing 3. Thus, the camera module Z is assembled.

Rlated arts are disclosed in Utility Model Registration Application Laid-open No. 47-33986 and Utility Model Registration Application Laid-open No. 64-29790.

With respect to the above prior art camera module Z shown in FIG. 11 and FIG. 12, however, the work to put the wires 4a,4a' through the through-hole 3f of the camera casing 3 (FIG. 13) is required.

And, in order to enhance the sealability of the through-hole 3f of the camera casing 3, the clamp 50 attached to the wiring harness 4 has to be tightened to the threaded portion provided indise the through-hole of the camera casing 3.

Further, the connector CR1 has to be coupled to the connector CR2. Therefore, the above work has to be carried out by hand, which requires much time and costs and therefore deteriorates the productivity.

And also, the wires 4a,4a' are likely to be caught between the camera module Y and the camera casing 3 as shown in FIG. 12. Accordingly, the wire 4a and the drain wire 4a' are likely to be cut off, thereby causing a defective.

SUMMARY OF THE INVENTION

In view of the foregoing, an object of the present invention is to provide an auxiliary module for attachably and detachably connecting a casing, provided with an auxiliary like a camera and with a baseplate, with mating parts like wires by using connectors and to a relaying component used in the auxiliary module, wherein a catch of the wires is prevented when the auxiliary module is assembled.

In order to achieve the above object, as a first aspect of the present invention, an auxiliary module use relaying component comprises: a flexible printed circuit; a first electrically connecting part attached to one end of the flexible printed circuit; and a second electrically connecting part attached to aother end of the flexible printed circuit, wherein the flexible printed circuit, the first electrically connecting part, and the second electrically connecting part are integrated with synthetic resin.

As a second aspect of the present invention, based on the first aspect, the flexible printed circuit has an insulative sheet and a plurality of circuit conductors extending from one end of the flexible printed circuit to another end thereof, terminals are provided on each of the first electrically connecting part and the second electrically connecting part, the terminals of the first electrically connecting part are connected to respective one ends of the circuit conductors of the flexible printed circuit, the terminals of the second electrically connecting part are connected to respective another ends of the circuit conductors of the flexible printed circuit, and the first electrically connecting part is electrically connected to the second electrically connecting part.

As a third aspect of the present invention, based on the first aspect, the flexible printed circuit is bent at a determined position and integrally formed with synthetic resin.

As a fourth aspect of the present invention, an auxiliary module use relaying component comprises: a plurality of busbars each having a first electrical contact portion on one end thereof, a second electrical contact portion on another end thereof, and a body portion connecting the first and second electrical contact portions, the busbars being integrated with synthetic resin, wherein a first connector main body portion having the first electrical contact portion is formed at one end, and a second connector main body portion having the second electrical contact portion is formed at another end.

As a fifth aspect of the present invention, based on the fourth aspect, each of the plurality of busbars is formed of sheet metal and bent at a determined position, and the plurality of busbars are integrally formed, in a parallel arrangement, with synthetic resin.

As a sixth aspect of the present invention, an auxiliary module comprisea: a baseplate having terminals and equipped with an auxiliary; a relaying component formed by integrally resin-molding a first electrically connecting portion having terminals and a second electrically connecting portion having terminals; and a casing, wherein a connector housing for the first electrically connecting portion is formed on the casing, a connector is formed on the casing by installing the first electrically connecting portion in the connector housing, and the terminals of the baseplate are connected to the terminals of the second electrically connecting portion when the baseplate is attached to the casing.

As a seventh aspect of the present invention, based on the sixth aspect, the connector of the casing is electrically connected with an outer connector.

As an eighth aspect of the present invention, based on the sixth aspect, an engaging portion is provided on the connector housing of the casing, and another engaging portion to engage the engaging portion is provided on the first electrically connecting portion of the relaying component.

As a ninth aspect of the present invention, based on the eighth aspect, a fixing portion is provided on the casing, and an attaching hole for the fixing portion is provided on the relaying component.

As a tenth aspect of the present invention, based on any one of the sixth to ninth aspects, the module is a camera mounted on a motor vehicle, while forming a camera module.

The above and other objects and features of the present invention will become more apparent from the following description taken in conjunction with the accompanying drawings.

BRIEF DESCRIPTION OF THE DRAWINGS

FIG. 7 is an enlarged perspective view showing the relaying component of the second embodiment;

FIG. 9 is a cross-sectional view of a wire;

FIG. 10 is an enlarged view of a part of a wiring harness having a clamp with an O-ring;

FIG. 11 is an exploded perspective view of a prior art camera module;

FIG. 12 is a perspective view showing the prior art camera module in a state of a trouble arising when the camera module is assembled to the camera casing.

DESCRIPTION OF THE PREFERRED EMBODIMENT(S)

Embodiment(s) of the present invention will now be described in further detail with reference to the accompanying drawings. The inventive auxiliary module Z and the relaying components (5)A,5B used therein are described with reference to FIG. 1–FIG. 9. The same references are assigned to the same members or elements as those of the prior art, and their detailed description is omitted.

Figure 1:
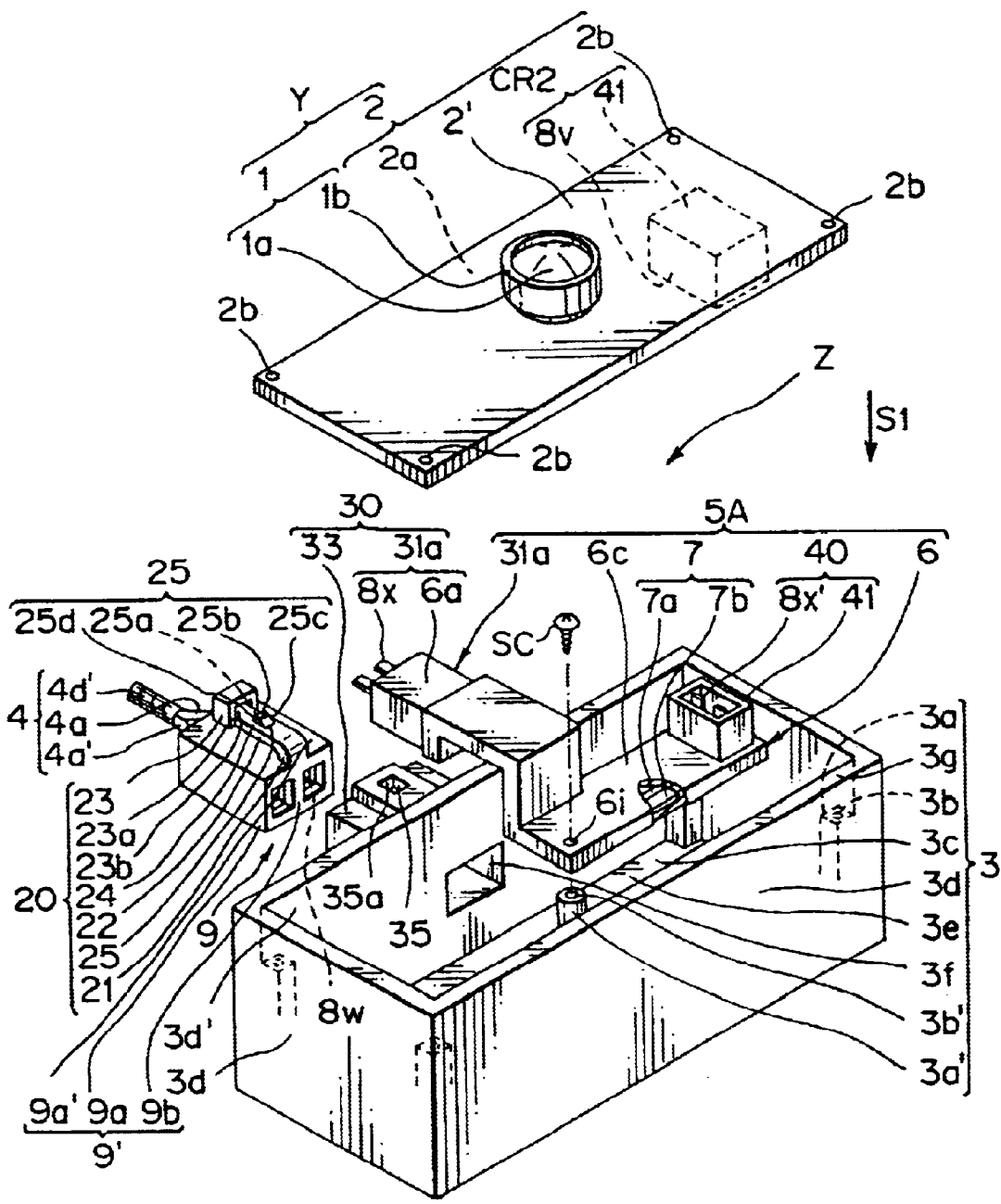
FIG. 1 is an exploded perspective view showing a first embodiment of the inventive relaying component and auxiliary module.

FIG. 1 is an exploded perspective view showing a first embodiment of the inventive relaying component and auxiliary module.

Figure 4:
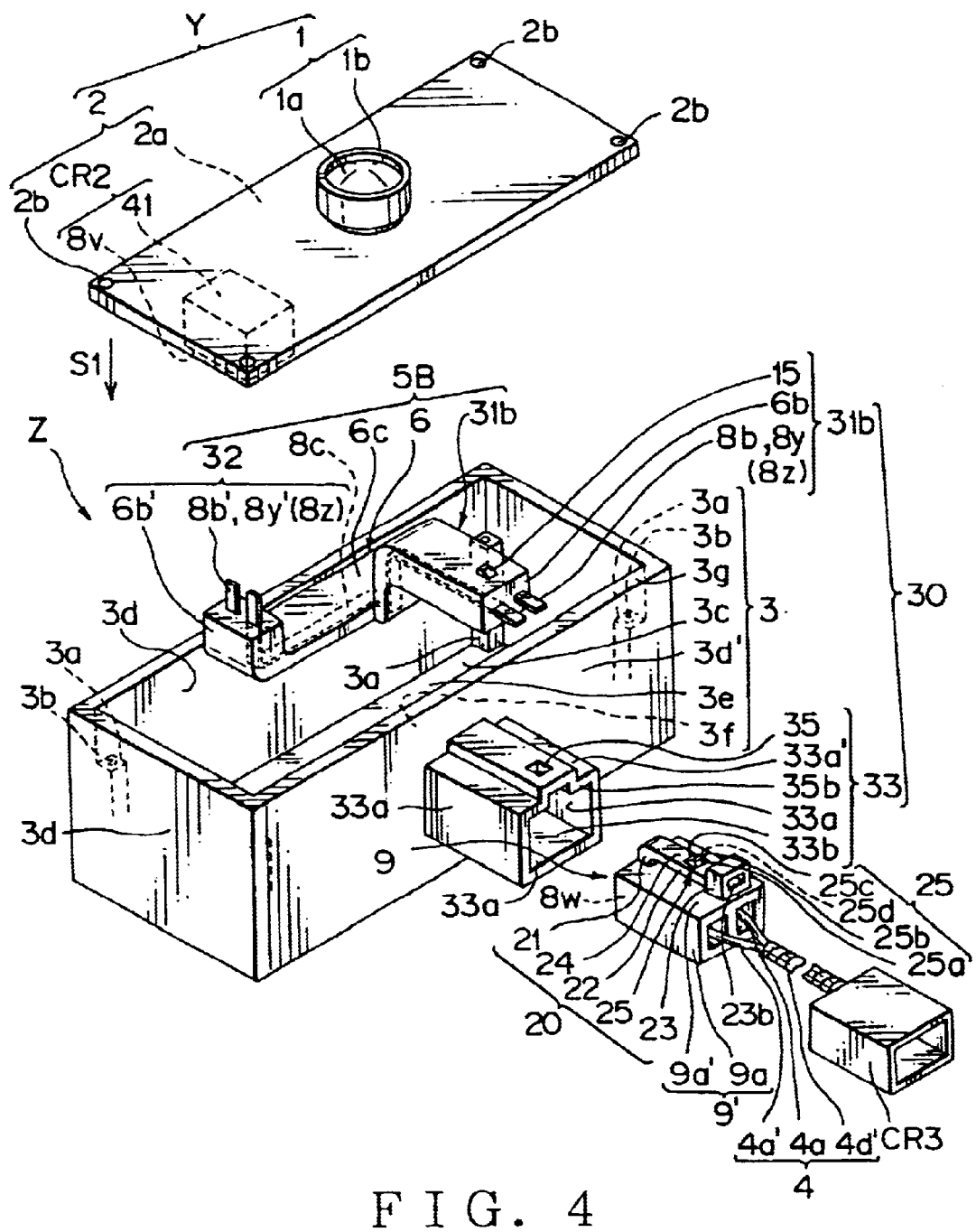
FIG. 4 is an exploded perspective view showing a second embodiment of the inventive relaying component and auxiliary module.
Figure 5:
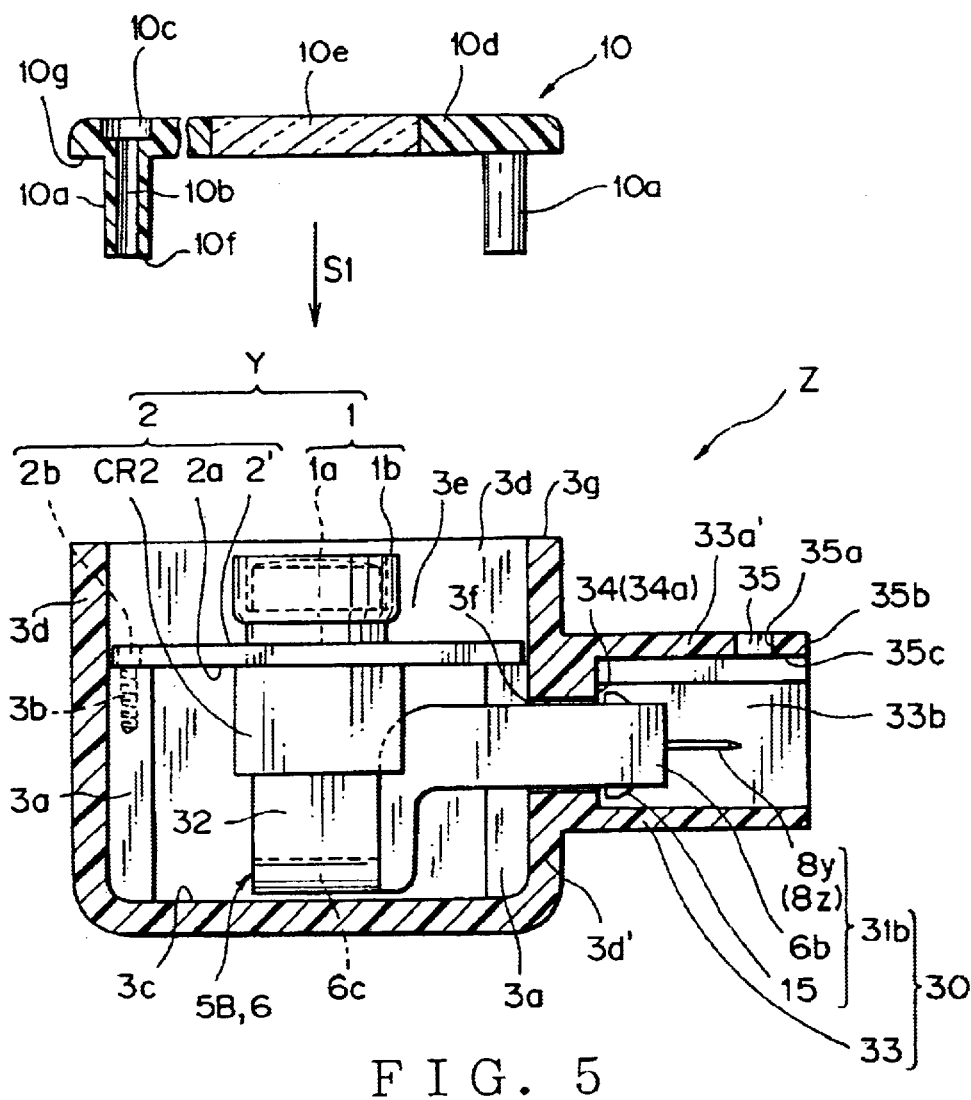
FIG. 5 is a longitudinal sectional view showing the auxiliary module of the second embodiment.

First, the direction of the camera module Z is described referring to FIGS. 1, 4, and 5. A side of a lens 1a of the camera module Z is the upper side here, and a bottom wall 3c side of the camera casing 3 is the bottom side. And, the wiring harness 4 side is is the front.

An auxiliary module Y has at least two components of a baseplate 2 and an auxiliary 1 such as a camera 1 and is called a camera module Y. And, the auxiliary module Z has at least three components of the auxiliary 1, i.e. the camera 1, the baseplate 2, and a casing 3, i.e. a camera casing 3 here, to which the baseplate 2 is attached and is called a camera module Z.

Wires 4a and drain wire 4a' each have at least one conductor 4b (FIG. 9) covered with an insulative cover 4c.

The camera may be a CCD camera or the one using MOS (Metal Oxide Semiconductor). MOS has an advatage of lower power consumption.

CCD mainly has a photodiode element being a photosensing element, a transfer gate, and an overflow drain, and has an electric charge taking-out system such as a frame transfer system and an interline transfer system.

Next, menbers of the camera modules Y,Z will be described. As shown in FIG. 1 and FIG. 4, the camera 1, being a CCD camera, has a lens 1a and a lens rim portion 1b.

As is shown in FIGS. 1, 4, and 5, the baseplate body 2' is formed in a rectangular plate. Circuit conductors are arranged on the baseplate body 2' of insulative resin, thereby forming a printed circuit board or a printed substrate. And, an insulating cover is provided on the printed circuit board including the circuit conductor for preventing electrical troubles.

Various electric devices such as relay, fuse, capacitor, semiconductor, terminal, busbar, connector, and wire may be mounted on the baseplate body 2'.

Figure 3:
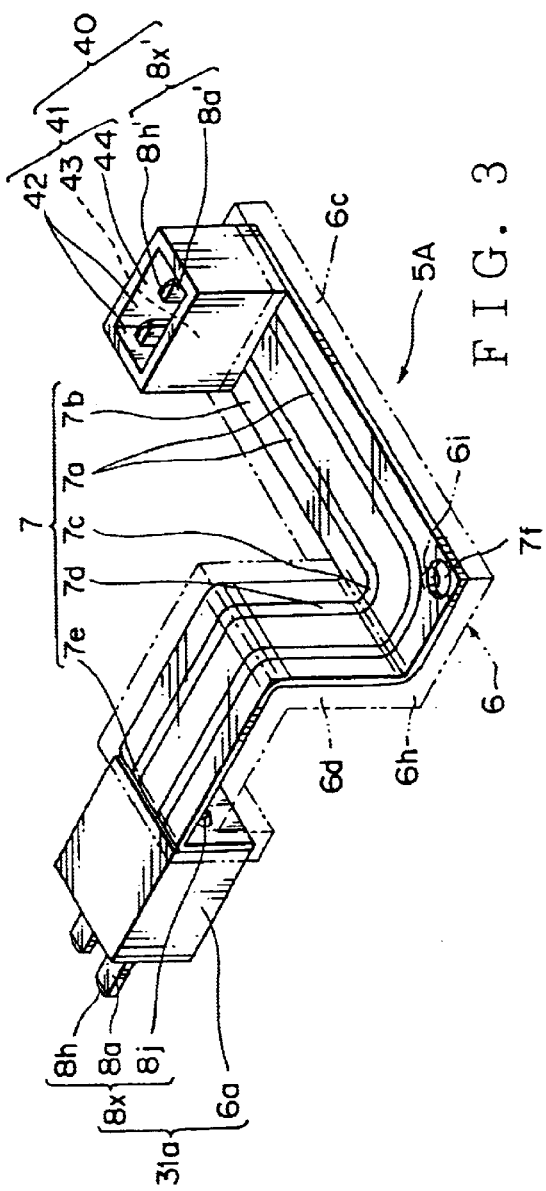
FIG. 3 is an enlarged perspective view showing the relaying component of the first embodiment.

As shown in FIGS. 1, 4, and 5, on the under surface 2a of the baseplate 2, a connector CR2 consisting of a connector housing 41 and a female terminals 8v are provided. The female terminal 8v installed in the accommodating chamber of the connector housing 41 of the connector CR2 is electrically connected to the circuit condoctor or wire. A second connector 40 of the relaying component 5A shown FIG. 1 and FIG. 3 is connected to the connector CR2. Otherwise, a second connector main body portion 32 of the relaying component 5B shown in FIGS. 4, 5, and 7 is connected to the above connector CR2.

As shown in FIG. 1 and FIG. 4, attaching holes 2b for fixing the baseplate 2 to the camera casing 3 by screws (not shown) are provided on the respective corners. The camera module Y, i.e. the baseplate 2 having the camera 1, is assembled to the casing 3. The baseplate 2 and the relaying components 5A,5B are, for example, made of synthetic resin bacause of moldability and insulativity.

An electrical contact portion of the busbar acts as a male terminal to be inserted in a female terminal, which busbar is formed of a metal plate. The male terminals 8x–8y', the female terminals 8v,8w, and the busbar 8z are, of course, made of conductive material. The busbar of the above type is integrally made by the press, thereby reducing the costs.

As shown in FIG. 1 and FIG. 4, the connector CR2 is soldered to a predetermined position of the circuit conductor of the baseplate body 2' as a part of the baseplate 2.

Figure 2:
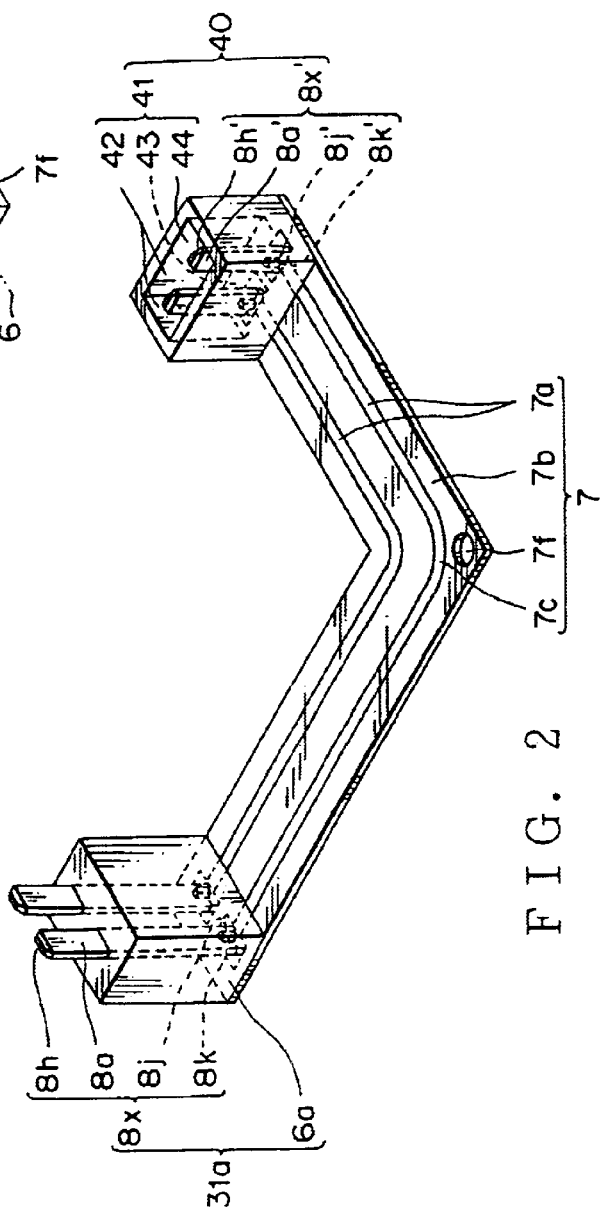
FIG. 2 is a perspective view showing a flexible printed circuit (FPC), a connector main body portion, and a second connector.

And, as shown in FIG. 2 and FIG. 3, a first electrically connecting part 31a, i.e. a connector main body portion 31a, is soldered to one end of the flexible printed circuit 7, and a second connector 40, i.e. a second electrically connecting part 40, is soldered to the other end of the flexible printed circuit 7.

Referring to FIGS. 1, 4, and 5, the camera casing 3 is surrounded by four sidewalls 3d and a bottom wall, thereby forming an accommodating chamber 3e. The baseplate 2 of the camera module Y has an attaching hole 2b at each corner, and the camera casing 3 has a fixing portion 3a with an internal-thread hole 3b at each corner of the accommodating chamber 3e for attaching the camera module Y.

A cover 10 (FIG. 5) is attached to the camera casing 3 in order to seal the module Z tightly from the outside. For sealing the module Z, a matching plane 10g being flat is provide on the cover 10 as shown in FIG. 5, and orrespondingly thereto a matching plane 3g is formed on the sidewalls 3d,3d' of the camera casing 3. A through-hole 3f is provided on the camera casing 3, which through-hole 3f connects the accommodating chamber 3e with the outside. The through-hole 3f communicates with an opening portion 30b of the connector housing 33 and with a connector frontage 30a (FIG. 6).

Figure 6:
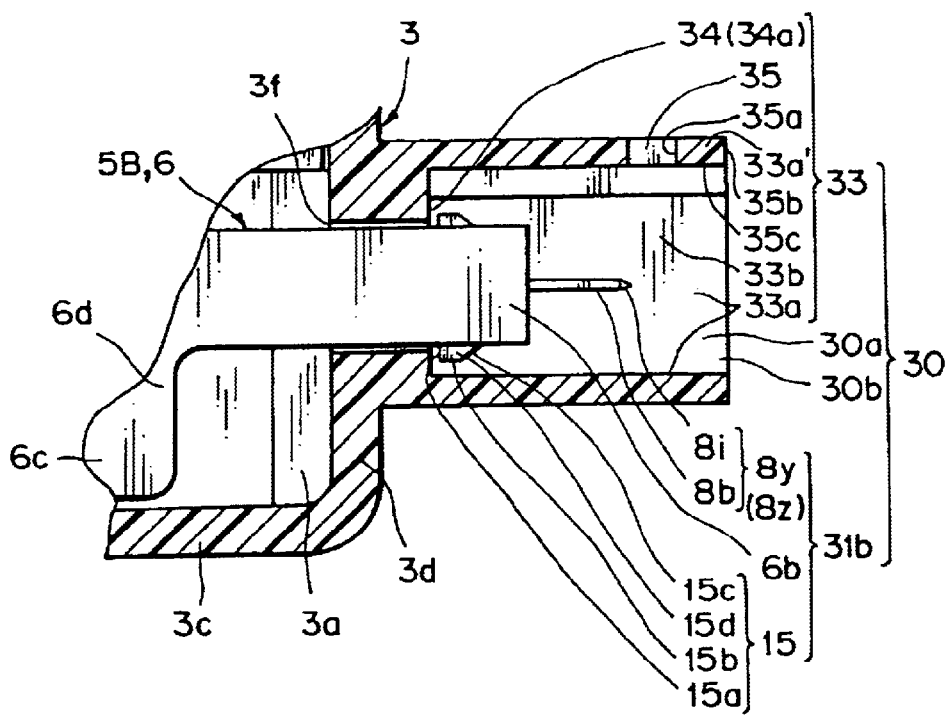
FIG. 6 is a longitudinal sectional view of a main portion of a connector of the auxiliary module shown in FIG. 5.

As shown in FIG. 4–FIG. 6, the connector housing 33 is formed of four sidewalls 33a,33a' and has a mating connector accommodating chamber 33b.

And, as shown in FIG. 4–FIG. 7, a pair of engaging portions 15 are provided on the first connector main body portion 31b of the relaying component 5B, and correspondingly thereto an engaging portion 34 (engaging plane 34a) is provided on the depth of the connector housing 33 of the camera casing 3.

When the mating connector 9 is inserted into the connector 30 of the camera module Z, a slide plane 25b of a locking projection 25 provided on a locking arm 20 of the mating connector 9 slides on a slide plane 35c (FIG. 5) of a sidewall 33a' inside of the connector housing 33. An end plane 35b of the connector housing 33 shown in FIG. 4 and FIG. 6 serves as a stopping wall for a front face 23a of an operating portion 23 of the locking arm 20 provided on the mating connector 9.

And, as shown in FIG. 1, 4–6, on the sidewall 33a' of the connector housing 33, an engaging portion 35, i.e. an engaging hole 35, is provided to engage the engaging portion 25 of the locking arm 20 of the mating connector 9.

The engaging hole 35 provided on the sidewall 33a' of the connector housing 33 is in a rectangular shape and has the engaging plane 35a on a side of the opening portion 30b of the connector housing 33. The engaging plane 35a of the engaging hole 35 engaes an engaging plane 25a of the locking projection 25 provided on the locking arm 20 of the mating connector 9 shown in FIG. 1 and FIG. 4.

And, the connector housing 33 is formed by the injection molding with the same material as that of the casing 3 integrally. The camera casing 3 and the cover 10 may be made of aluminium alloy or synthetic resin.

As shown in FIG. 1 and FIG. 4, the wiring harness 4 extends from the connector housing 9' of the mating connector 9. The wires 4a,4a' are bundled up with a tape 4d' or a flexible waterproofing tube. The wires 4a,4a' forming the wiring harness 4 has the conductors 4b and the insulative cover 4c, while leaving small gaps 4b', as shown in FIG. 9.

Figure 13:
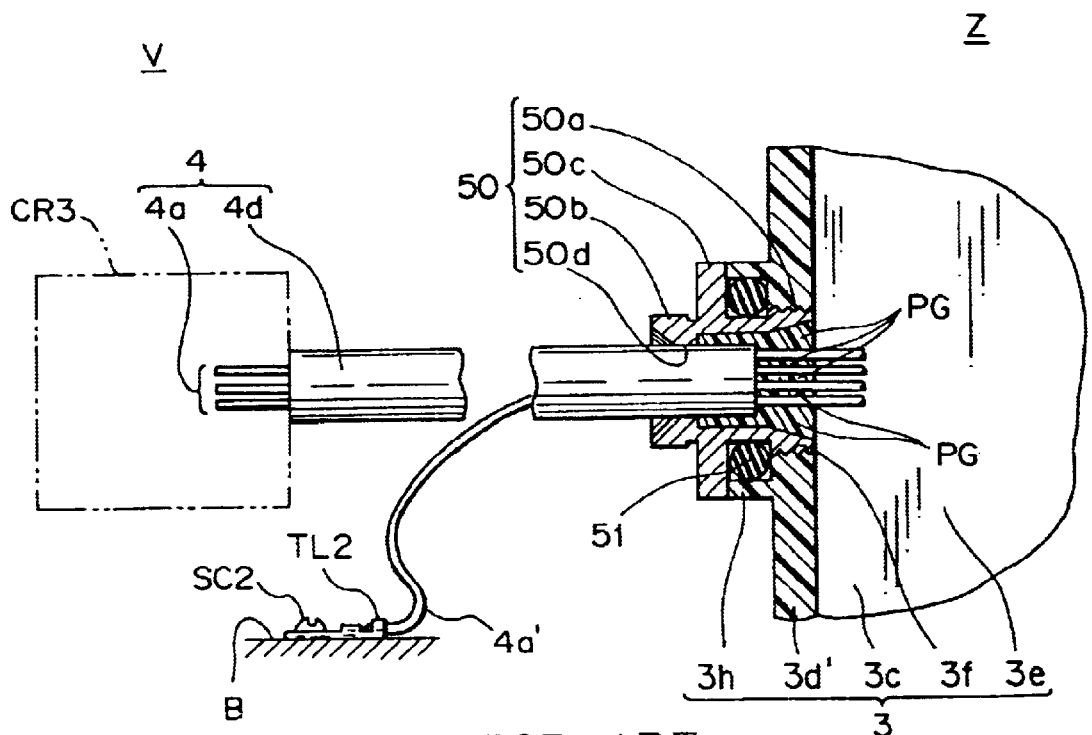
FIG. 13 is a partial sectional view, taken along a line R—R in FIG. 11 and FIG. 12, of the camera casing, while showing another parts to which a wiring harness is connected.

A non-waterproof connector CR3 (FIG. 4) equipped in a vehicle is electrically connected to the camera module Z by the wiring harness 4. The drain wire 4a', i.e. a grounding line, of the wiring harness 4 (cf. FIG. 13) is connected to the terminal TL2 which is attached to a frame of a vehicle body B by the screw SC2.

As shown in FIGS. 2,3, the flexible printed circuit (FPC) 7 has the circuit conductors 7a arranged in parallel on an insulative sheet 7b and a protective layer provided thereon. Here, a wiring harness having both the wire and an optical fiber may be used.

Hereinafter, the first embodiment of the present invention, shown in FIG. 1–FIG. 3, is described. As shown in FIG. 2 and FIG. 3, the first electrically connecting part 31a, i.e. the connector main body portion 31a, forming one part of the first connector 30 is attached to one end of the flexible printed circuit 7. And, the second electrically connecting part 40, i.e. the second connector 40, is attached to the other end of the flexible printed circuit 7.

And, as shown in FIG. 1 and FIG. 3, the flexible printed circuit 7, the connector main body portion 31a, and the second connector 40 constitute the auxiliary module use relaying component 5A, which may be called a relaying connector 5A.

The second connector 40 has the connector housing 41 and two male terminals 8x'. The connector housing 41 of the second connector 40 has an accommodating chamber 43 formed by four sidewalls 42 and a bottom portion. And, an opening portion 44 is provided on the second connector 40. The accommodating chamber 43 of the second connector 40 continues from the opening portion 44.

Referring to FIG. 2 and FIG. 3, the flexible printed circuit 7 has two circuit conductors 7a having respective bent portions 7c and an insulative sheet 7b.

The connector main body portion 31a has two male terminals 8x. Terminal insertion holes corresponding to respective rear end portions 8j,8j' of the male terminals 8x,8x' are provided on the flexible printed circuit 7.

Inside the terminal insertion holes, the circuit conductors 7a covered by the insulative sheet 7b are exposed. The exposed circuit conductors 7a are electorically connected with the rear end portions 8j,8j' of the male terminals 8x,8x', for example, by means of the soldering.

The male terminals 8x are provided on a base portion 6a of the connector main body portion 31a. And, projecting portions 8k,8k' are provided on the vicinitys of the rear end portions 8j,8j' of the male terminals 8x,8x' so that the male terminals 8x,8x' are securely fixed to the basis portion 6a of the connector main body portion 31a and the connector housing 41, respectively.

The rear end portion 8j of the male terminal 8x of the connector main body portion 31a is inserted in one terminal insertion hole of the flexible printed circuit 7, and the rear end portion 8j' of the male terminal 8x' of the second connector 40 is inserted in the other insertion hole of the flexible printed circuit 7.

The rear end portions 8j,8j' of the male terminals 8x,8x' project from the back side of the flexible printed circuit 7 as partly shown in FIG. 3. The rear end portion 8j of the male terminal 8x is soldered to one end of the circuit conductor 7a, and the rear end portion 8j' of the male terminal 8x' is soldered to the other end of the circuit conductor 7a.

As stated above, as shown in FIG. 1, the relaying connector 5A electrically connects the baseplate 2 having the camera 1 to the connector 30 provided on the camera casing 3, whereby the number of parts can be reduced and the assembly workabikity can be improved. And, the relaying connector 5A can be easily detached from the camera module Z, whereby workabikity about inspection, repair, and recycling can be improved. And, the reduction of the number of parts can lower the cost of the camera module Z.

As shown in FIG. 3, the flexible printed circuit 7 having the circuit conductors 7a and the insulative sheet 7b is flexible. The flexible printed circuit 7 is bent and an ell-bent portions 7d,7e are formed on the flexible printed circuit 7. The connector main body portion 31a, the second connector 40, and the flexible printed circuit 7 are integrally formed with a resin-molded portion 6, i.e. hot-melt material such as polyamide resin, thereby forming the relaying connector 5A.

And, as shown in FIG. 2 and FIG. 3, the bent portion 7c is formed on the flexible printed circuit 7. The resin-molded portion 6 is mainly made up of a body portion 6c, a side portion 6d, and a bent portion 6h.

With the above structure, correspondingly to the through-hole 3f and the connector housing 33 provided on the camera casing 3 and also to the position and the form of the connector CR2 provided on the baseplate 2 having the camera 1, the relaying connector 5A can have an arbitrary shape. And, correspondingly to the shape of the components constituting the camera module Z, the relaying connector 5A can be easily attached and detached.

Correspondingly to the attaching hole 3b' of the fixing portion 3a' of the camera casing 3, an attaching hole 6i (FIG. 3) is provided on the relaying connector 5A. The attaching hole 6i of the relaying connector 5A coaxially corresponds to a hole 7f provided on the flexible printed circuit 7. The attaching hole 6i is smaller thatn the hole 7f.

By this, the relaying connector 5A can be easily, quickly, and securely attached to, or detached from, the accommodating chamber 3e of the camera casing 3. By inserting the connector main body portion 31a of the relaying component 5A in the through-hole 3f, the connector 30 is formed on the camera casing 3. Subsequently, the screw SC is put through the attaching hole 6i of the relaying connector 5A, and the screw SC is screwed to the fixing portion 3a' of the internal-thread hole 3b' of the camera casing 3, whereby the relaying component 5A is securely attached to the camera casing 3.

Next, a second embodiment of the present invention is described with reference to FIG. 4–FIG. 8. As shown in FIG. 4 and FIG. 7, an auxiliary module use relaying component 5B has a first connector main body portion 31b having a first electrical contact portion 8b on the one end and a second connector main body portion 32 having a second electrical contact portion 8b' on the other end. The auxiliary module use relaying component 5B has two relaying busbars 8z, in synthetic resin, each of which has a first electrical contact portion 8b on one end thereof, a second electrical contact portion 8b' on the other end, and a body portion 8c connecting the first electrical contact portion 8b and the second electrical contact portion 8b'.

By this, as shown in FIG. 4, the relaying connector 5B electrically connects the baseplate 2 having the camera 1 to the connector 30 provided on the camera casing 3, whereby the number of parts can be reduced and the assembly workabikity can be improved. And, the relaying connector 5B can be easily detached from the camera module Z, whereby workabikity about inspection, repair, and recycling can be improved. And, the reduction of the number of parts can lower the cost of the camera module Z.

Figure 8:
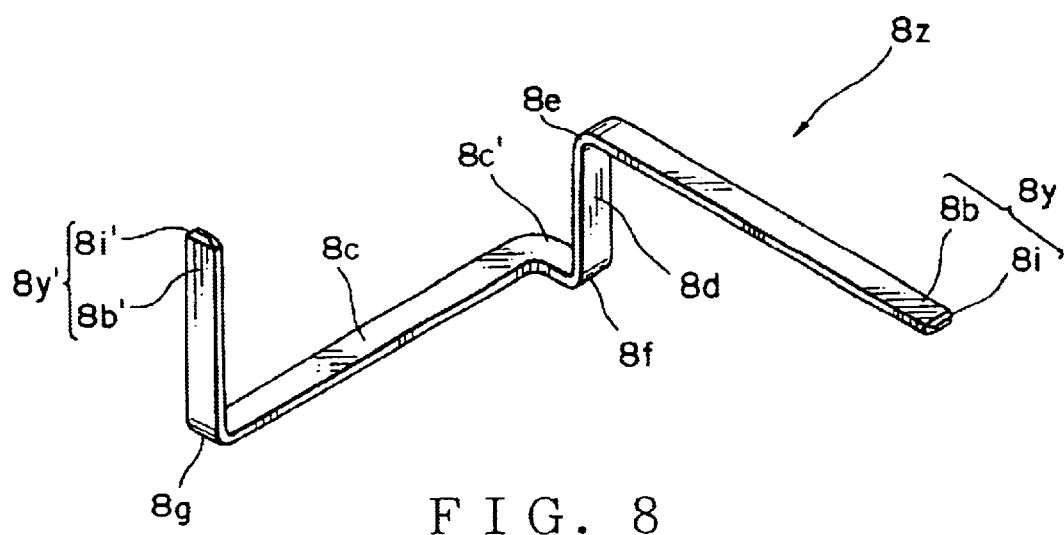
FIG. 8 is an enlarged perspective view showing a busbar.

And, the above busbars 8z are formed of a sheet metal. As shown in FIG. 7 and FIG. 8, ell-bent portions 8e,8f,8g are formed on the busbar 8z. And, as shown in FIG. 7, the busbars 8z are insert-molded in resin, i.e. in a resin-molded portion 6. The resin-molded portion 6 mainly consists of two base portions 6b,6b', a body portion 6c, a side portion 6d, and bent portions 6e,6f,6g.

With the above structure, correspondingly to the through-hole 3f and the connector housing 33 provided on the camera casing 3 and also to the position and the form of the connector CR2 provided on the baseplate 2 having the camera 1, the relaying connector 5B can have an arbitrary shape. And, correspondingly to the shape of the components constituting the camera module Z, the relaying connector 5B can be easily attached and detached.

And, correspondingly to the engaging portion 34 (FIG. 5 and FIG. 6) of the connector housing 33 of the camera casing 3, engaging portions 15 (projections) are provided on the first connector main body portion 31b of the relaying component 5B as shown in FIG. 4–FIG. 7. And, as shown in FIG. 5 and FIG. 6, By this, the relaying connector 5B can be easily, quickly, and securely attached to, or detached from, the accommodating chamber 3e of the camera casing 3. The first connector main body portion 31b of the relaying component 5B is inserted into the through-hole 3f so that the connector 30 is formed on the camera casing 3.

Referring to FIG. 6, the engaging portion 15 provided on the first connector main body portion 31b of the relaying component 5B has an engaging plane 15a, a slide plane 15b, an inclined slide plane 15c, and side surfaces 15d. A distance between one slide plane 15b and the other slide plane 15b is larger than the height of the through-hole 3f of the camera casing 3.

And, when the connector main body portion 31b of the relaying component 5B is inserted into the through-hole 3f of the camera casing 3, the pair of projections 15 are elastically deformed.

After the projections 15 of the first connector main body portion 31b pass through the through-hole 3f, the projections 15 resile. And, the engaging planes 15a of the projections 15 engage the engaging planes 34a of the engaging portion 34 provided on the depth of the accommodating chamber 3e of the connector housing 33, whereby the connector main body portion 31b of the relaying component 5B and the connector housing 33 of the camera casing 3 engage each other.

The camera module Z using the relaying component 5A being the first embodiment and the camera module Z using the relaying component 5B being the second embodiment are describe hereinafter with reference to FIG. 1 and FIG. 4.

The relaying components 5A,5B molded integrally by using synthetic resin have the respective baseplates 2 having the female terminals 8v and the cameras 1, the first electrically connecting portions 31a,31b having the male terminals 8x,8y, and the second electrically connecting portions 40,32 having the male terminals 8x',8y'. The relaying components 5A,5B are assembled to the respective camera modules Z having the respective camera casings 3.

And, correspondingly to the first electrically connecting portions 31a,31b of the relaying components 5A,5B, the connector housings 33 are formed on the camera casings 3.

The first electrically connecting portions 31a,31b are inserted into the through-holes 3f of the connector housings 33 so that the connectors 30 can be formed on the camera casings 3.

Further, when the above baseplates 2 are attached to the respective camera casings 3, the female terminals 8v of the baseplates 2 are connected to the male terminals 8x',8y' of the second electrically connecting portions 40,32 of the relaying components 5A,5B, thereby forming the camera modules Z.

Here, in the first embodiment, the two male terminals 8x' in the accommodating chamber 43 of the connector housing 41 of the second connector 40 shown in FIG. 3 are connected to the female terminals 8v (FIG. 1) in the connector housing 41 of the connector CR2 attached to the baseplate 2. And, in the second embodiment, the two male terminals 8y' of the second connector main body portion 32 shown in FIG. 7 are connected to the the female terminals 8v (FIG. 4) in the connector housing 41 of the connector CR2 attached to the baseplate 2.

By attaching the relaying components 5A,5B having the first electrically connecting portions 31a,31b provided with the male terminals 8x,8y to the respective camera casings 3, the connectors 30 are fromed on the camera modules Z. By attaching the baseplates 2 having the cameras 1 and the female terminals 8v to the camera casings 3, the cameras 1 are connected to the respective connectors 30 through the relaying components 5A,5B, thereby improving the assembling workability. That is, because the auxiliary 1 such as the camera 1 can be independent from the wiring harness 4, the plurality of parts to be attached to the casing 3 can be independently assembled in a separated process.

Also, the camera module Z is easy to be disassembled and therefore easy to be recycled. And, because the relaying components 5A,5B can be easily detached from the camera modules Z, assembly and disassembly of the camera modules Z for inspection or repair can be easily carried out.

Further, differently from the prior art camera module, because the relaying components 5A,5B having the first electrically connecting portions 31a,31b provided the male terminals 8x,8y are used, the connectors 30 can be easily fromed upon the assembly of the camera modules Z, thereby facilitating the assembly of the camera module Z.

And, the wiring harness 4 can be detached from the camera module Z without disassembling the camera module Z, thereby providing better maintenancability of the camera module Z.

Here, the mating connector 9 to be coupled to the connector 30 of the camera module Z is described with reference to FIG. 1 and FIG. 4. The mating connector 9 has a connector housing 9' with sidewalls 9a,9a', an accommodating chamber formed in the connector housing 9', and female terminals 8w in the accommodating chamber. The accommodating chamber has a terminal connecting side opening portion 9b.

As shown in FIG. 1 and FIG. 4, the female terminals 8w, connected with the wiring harness 4, of the mating connector 9 are electrically connected with the male terminals 8x or 8y (FIG. 4) of the connector 30 of the camera casing 3.

Like this, the electrical connection can be easily attained only by coupling the mating connector 9 of the wiring harness 4 with the connector 30 of the camera casing 3, thereby reducing the trouble and the cost.

And, the wiring harness 4 can be detached from the camera module Z without disassembling the camera module Z, thereby providing better maintenancability of the camera module Z.

On the sidewall 9a' of the resinous connector housing 9' of the mating connector 9, the locking arm 20 is formed integrally with the sidewall 9a'. As shown in FIG. 1 and FIG. 4, the locking arm 20 mainly has a root portion 21, an arm 22, and an operating portion 23. An arm reference plane 24 is is formed generally in parallel with the sidewall 9a'.

The back surface of the arm reference plane 24 gradually gets apart from the sidewall 9a' of the connector housing 9' and becomes thiner toward the operating portion 23.

Correspondingly to the engaging hole 35 of the connector 30 of the camera module Z shown in FIGS. 1,4,6, the engaging portion 25 is provided on the arm 22 of the locking arm 20 as shown in FIG. 1 and FIG. 4. On the arm reference plane 24, the locking projection 25 being the engaging portion is provided. The locking projection 25 has the engaging plane 25a, the slide plane 25b, the inclined slide plane 25c, and two side surfaces 25d. The engaging plane 25a of the locking projection 25 eagages the engaging plane 35a of the engaging hole 35.

When the mating connector 9 is coupled with the connector 30 of the camera module Z, the front face 23a of the operating portion 23 of the mating connector 9 abuts the end plane 35b of the connector housing 33 formed on the camera module Z. The engaging plane 25a of the locking projection 25 provided on the locking arm 20 and the front face 23a of the operating portion 23 are in parallel with each other. As shown in FIG. 4, the operating portion 23 has an escape portion 23b.

With the above engaging means, the coupling and discoupling of the connector 30 of the camera casing 3 and the mating connector 9 of the wiring harness 4 can be easily and quickly carried out.

Referring to FIG. 4–FIG. 6, the coupling and discouping of the connector 30 of the camera casing 3 and the mating connector 9 of the wiring harness 4 is described. Here, the coupling and discouping of the mating connector 9 and the connector 30 shown in FIG. 1 is the same as that of FIG. 4–FIG. 6.

As shown in FIG. 4, when the mating connector 9 begins to be inserted in the connector housing 33 of the connector 30 of the camera module Z, the locking arm 20 begins to be inserted in the connector housing 30 of the connector 30 from the root portion 21 thereof.

The mating connector 9 is further inserted into the connector 30, the inclined slide plane 25c of the locking projection 25 on the locking arm 20 of the mating connector 9 abuts the sidewall 33a' of the connector housing 33.

The mating connector 9 is still further inserted into the mating connector accommodating chamber 33b of the connector 30, the slide plane 25b of the locking projection 25 of the locking arm 20 slides on the slide plane 35c of the sidewall 33a' of the connector housing 33.

During the above process, the locking arm 20 is flexed toward the sidewall 9a' of the connector housing 9' of the mating connector 9. And, the locking projection 25 provided on the locking arm 20 of the mating connector 9 enters and engages the engaging hole 35 provided on the connector housing 33.

Specifically, the engaging plane 25a of the locking projection 25 provided on the locking arm 20 of the mating connector 9 engages the engaging plane 35a of the engaging hole 35 provided on the connector housing 33 of the camera module Z.

With the above engaging structure, even if the wiring harness 4 is pulled, the mating connector 9 keeps coupled with the connector 30 of the camera module Z.

When the mating connector 9 is completely coupled with the connector 30, the front face 23a of the operating portion 23 provided on the locking arm 20 of the mating connector 9 abuts the end plane 35b provided on the connector housing 33 of the camera module Z with a small gap. Therefore, the mating connector 9 does not excessively go into the connector 30 of the camera module Z, thereby preventing damage of the connector 30 and the mating connector 9.

When the mating connector 9 attached to the wiring harness 4 is detached from the camera module Z, the locking arm 20 of the mating connector 9 is released by pushing the operating portion 23 of the locking arm 20 toward the sidewall 9a' of the connector housing 9' of the mating connector 9.

With the above, the engaging plane 25a of the locking projection 25 provided on the locking arm 20 is disengaged from the engaging plane 35a of the connector housing 33 of the camera module Z.

Next, the cover 10 is described. As shown in FIG. 5, the cover 10 has a rectangular body 10d. And, a window 10e for the camera 1 is provided on the body 10d of the cover 10. The window 10e has a transparent plate made of resin, glass, or the like for keeping the sight and the sealability. Here, the transparent plate may be eliminated according to the circumstance where the auxiliary module Z is used.

Correspondingly to fixing portions 3a with respective attaching holes 3b provided at the respective corners in the accommodating chamber 3e of the camera casing 3, fixing portions 10a with respective attaching holes 10b and respective spot faced portions 10c are provided at the respective corners of the cover 10. And, for desirably sealing up the camera module Y from the outside, a matching plane 10g is provided on the body 10d of the cover 10 correspondingly to a matching plane 3g of the camera casing 3. And, since the fixing portion 10a of the cover 10 abuts and presses the baseplate 2 for fixing the baseplate 2 inside the camera casing 3, a matching plane 10f is formed at the bottom of the fixing portion 10a of the cover 10.

The camera casing 3 having the connector housing 33, the relaying component 5A,5B having the resin-molded portion 6, the connector housing 9' of the mating connector 9, and the cover 10 are preferably made of thermoplastic synthetic resin by the injection molding for better productivity.

Referring to FIG. 1–FIG. 7, corner portions of the camera 1, the baseplate 2, the camera casing 3, the relaying components 5A,5B, the connector housing 9' of the mating connector 9, and the cover 10 may be rounded.

A manufacturing and assembly method of the relaying component 5A (the first embodiment), that of the relaying component 5B (the second embodiment), and that of the auxiliary module Z to which the relaying component 5A or 5B is installed is described hereinafter.

First, a manufacturing and assembly method of the first embodiment shown in FIG. 1–FIG. 3 is described. The male terminals 8x,8x' have respective first and second electrical contact portions 8a,8a', front end portions 8h,8h', rear end portions 8j, 8j', and projecting portions 8k,8k'.

The connector main body portion 31a is formed by integrally molding the male terminal 8x with the base portion 6a of synthetic resin. And, the second connector 40 is formed by integrally molding the male terminal 8x' with the connector housing 41 of synthetic resin.

Next, the connector main body portion 31a and the second connector 40 are arranged on the flexible printed circuit 7. And, the rear end portions 8j, 8j' of the respective terminals 8x,8x' of the connector main body portion 31a and the second connector 40, respectively, are electrically connected by the soldering to the circuit conductor 7a of the flexible printed circuit 7.

And, a hole 7f is provided on the flexible printed circuit 7 correspondingly to the attaching hole 6i provided on the resin-molded portion 6 of the relaying connector 5A.

The flexible printed circuit 7 is bent to form the ell-bent portions 7d,7e thereon. And, the flexible printed circuit 7 with the connector main body portion 31a and the second connector 40 is attached to a metal mold.

Next, thermoplastic synthetic resin, such as polyamide resin, is poured around the flexible printed circuit 7 and cooled. Thus, the connector main body portion 31a, the second connector 40, and the flexible printed circuit 7 connecting these are intagrally molded to form the relaying component 5A.

And, the relaying component 5A is fixed in the accommodating chamber 3e of the camera casing 3 by screwing the screw SC into the internal-thread hole 3b' of the camera casing 3 through the attaching hole 6i.

The connector CR2 is soldered on a determined position of the baseplate body 2' such that the connector CR2 can be coupled with the second connector 40 of the relaying component 5A. The baseplate 2, i.e. the camera module Y, with the camera 1 and the connector CR2 thereon is attached to the camera casing 3, whereby the connector CR2 is electrically-connected to the second connector 40.

Next, a manufacturing and assembly method of the second embodiment shown in FIG. 4–FIG. 9 is described.

The relaying busbar 8z has the first electrical contact portion 8b, the second electrical contact portion 8b', the body portion 8c, the bent portion 8c', the flat section 8d, the ell-bent portions 8e–8g, and the end portions 8i,8i'.

A plurarity of relaying busbars 8z are insert-molded in thermoplastic synthetic resin, while forming the resin-molded portion 6. Like this, the relaying component 5B is formed.

On the relaying component 5B, the first electrical contact portions 8b and the second electrical contact portions 8b' project from the first connector main body portion 31b and the second connector main body portion 32, respectively.

In the passing-through hole 3f of the connector housing 33 one end side of the relaying component 5B is inserted and fixed, whereby the relaying component 5B is assembled to the connector housing 33 and simultaneously the connector 30 is formed on the camera casing 3.

The connector CR2 is soldered on a determined position of the baseplate body 2 such that the connector CR2 can be coupled with the second connector main body portion 32 of the relaying component 5B. The baseplate 2, i.e. the camera module Y, with the camera 1 and the connector CR2 thereon is attached to the camera casing 3, whereby the connector CR2 is electrically connected to the second connector main body portion 32.

With the above, because the wires 4a,4a' are not directly arrnged in the camera casing 3, the wires are not put between the camera module Y and the camera casing 3 when the baseplate 2 is installed in the camera casing 3, thereby preventing the conductors 4b in the wire from being damaged. And, even if the camera module Z is damaged, the camera module Z can be easily repared.

In the first embodiment of FIG. 1 and also in the second embodiment of FIG. 4, the mating connector 9 is coupled to the connector 30 of the camera casing 3, and the cover 10 is attached.

As state above, the camera module Z as the first or second embodiment is formed.

The inventive auxiliary module Z can reduce the number of parts, thereby enabling the module Z to be downsized, light-weighted, and cost-reduced. The inventive auxiliary module Z is, however, applicable to an instrument panel or the like of a motor vehicle.

Also, the inventive auxiliary module Z, i.e. the camera module Z, applicable to a vehicle rear-monitoring system. In this case, even if the CCD camera 1 attached to an outside of a motor vehicle is damaged, the onboard CCD camera 1 can be easily disassembled and repaired.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. An auxiliary module use relaying component, comprising:
    a flexible printed circuit;
    a first electrically connecting part attached to one end of the flexible printed circuit; and
    a second electrically connecting part attached to aother end of the flexible printed circuit,
    wherein the flexible printed circuit, the first electrically connecting part, and the second electrically connecting part are integrated with synthetic resin.

2. The auxiliary module use relaying component as set forth in claim 1, wherein
    the flexible printed circuit has an insulative sheet and a plurality of circuit conductors extending from one end of the flexible printed circuit to another end thereof,
    terminals are provided on each of the first electrically connecting part and the second electrically connecting part,
    the terminals of the first electrically connecting part are connected to respective one ends of the circuit conductors of the flexible printed circuits,
    the terminals of the second electrically connecting part are connected to respective another ends of the circuit conductors of the flexible printed circuit, and
    the first electrically connecting part is electrically connected to the second electrically connecting part.

3. The auxiliary module use relaying component as set forth in claim 1, wherein
    the flexible printed circuit is bent at a determined position and integrally formed with synthetic resin.

4. An auxiliary module use relaying component consisting of two pairs of electrical contact portions, comprising:
    a plurality of busbars connected to a first of said two pairs of electrical contact portions on one end thereof, and a second of said two pairs of electrical contact portions on another end thereof and
    a body portion connecting the first and second pairs of electrical contact portions, the busbars being integrated with synthetic resin,
    wherein a first connector main body portion having the first pair of electrical contact portion if formed at one end, and a second connector main body portion having the second pair of electrical contact portion is formed at another end.

5. The auxiliary module use relaying component as set forth in claim 4, wherein
  each of the plurality of busbars is formed of sheet metal and bent at a determined position, and the plurality of busbars are integrally formed, in a parallel arrangement, with synthetic resin.

6. An auxiliary module consisting of two pairs of electrical contact portions, comprising:
  a baseplate having terminals and equipped with an auxiliary;
  a relaying component formed by integrally resin-molding a first of said two pairs of electrically connecting portion having terminals and a second of said two pairs of electrically connecting portion having terminals; and
  wherein a connector housing for the first pair of electrically connecting portion is formed on the casing,
  a connector is formed on the casing by installing the first pair of electrically connecting portion in the connector housing, and
  the terminals of the baseplate are connected to the terminals of the second pair of electrically connecting portion when the baseplate is attached to the casing.

7. The auxiliary module as set forth in claim 6, wherein the connector of the casing is electrically connected with an Outer connector.

8. The auxiliary module as set forth in claim 6, wherein
  an engaging portion is provided ca the connector housing of the casing, and another engaging portion to engage the engaging portion is provided on the first electrically connecting portion of the relaying component.

9. The auxiliary module as set forth in claim 8, wherein
  a fixing portion is provided on the casing, and an attaching hole for the fixing portion is provided on the relaying component.

10. The auxiliary module as set forth in claim 6, wherein
  the module is a camera mounted on a motor vehicle, while forming a camera module.

11. The auxiliary module as set forth in claim 7, wherein
  the module is a camera mounted on a motor vehicle, while forming a camera module.

12. The auxiliary module as set forth in claim 8, wherein
  the module is a camera mounted on a motor vehicle, while forming a camera module.

13. The auxiliary module as set forth in claim 9, wherein the module is a camera mounted on a motor vehicle, while forming a camera module.

* * * * *